United States Patent
Chun et al.

(10) Patent No.: US 9,916,410 B2
(45) Date of Patent: *Mar. 13, 2018

(54) SIGNAL VIA POSITIONING IN A MULTI-LAYER CIRCUIT BOARD

(71) Applicant: International Business Machines Corporation, Armonk, NY (US)

(72) Inventors: Sungjun Chun, Austin, TX (US); Matteo Cocchini, Long Island City, NY (US); Michael A. Cracraft, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/745,964

(22) Filed: Jun. 22, 2015

(65) Prior Publication Data

US 2016/0371416 A1     Dec. 22, 2016

(51) Int. Cl.
*G06F 17/50*   (2006.01)

(52) U.S. Cl.
CPC ................... *G06F 17/5077* (2013.01)

(58) Field of Classification Search
CPC .................................................. G06F 17/5077
See application file for complete search history.

(56) References Cited

U.S. PATENT DOCUMENTS

| | | | |
|---|---|---|---|
| 5,784,262 A | 7/1998 | Sherman | |
| 6,037,547 A | 3/2000 | Blish, II | |
| 6,919,635 B2 | 7/2005 | Kawasaki et al. | |
| 7,709,747 B2 | 5/2010 | Morlion et al. | |
| 7,935,896 B2 | 5/2011 | Morlion et al. | |
| 8,129,625 B2 | 3/2012 | Kato | |
| 8,383,951 B2 | 2/2013 | Morlion et al. | |

(Continued)

FOREIGN PATENT DOCUMENTS

JP     4299087     4/2005

OTHER PUBLICATIONS

List of IBM Patents or Patent Applications Treated as Related, Sep. 2, 2015, 2 pages.

(Continued)

*Primary Examiner* — Vuthe Siek
(74) *Attorney, Agent, or Firm* — Cantor Colburn LLP; Teddi Maranzano (57) ABSTRACT

One aspect is a method that includes identifying a substantially uniform distribution of signal vias for a multi-layer circuit board based on a design file defining a layout that includes via groups in a two-to-one signal-to-ground via ratio configuration. A signal via pitch is determined as a center-to-center distance between a neighboring pair of signal vias. The signal via pitch is compared to a target minimum drilling distance. A ground via is identified proximate the neighboring pair of the signal vias. Based determining that the signal via pitch of the neighboring pair is less than the target minimum drilling distance, at least one of the signal vias is positioned closer to the ground via such that after the positioning, the signal via pitch of the neighboring pair meets or exceeds the target minimum drilling distance. The design file is modified to include the positioning of the signal vias.

15 Claims, 8 Drawing Sheets

(56) References Cited

U.S. PATENT DOCUMENTS

| | | |
|---|---|---|
| 8,669,597 B2 | 3/2014 | Fang et al. |
| 9,730,313 B2 | 8/2017 | Gailus et al. |
| 2011/0145778 A1* | 6/2011 | Chen .................. G06F 17/5054 716/136 |
| 2011/0155434 A1 | 6/2011 | Reynov et al. |
| 2013/0330941 A1* | 12/2013 | Jeon .................... H01R 12/585 439/65 |
| 2014/0093321 A1 | 4/2014 | Liu |
| 2015/0362547 A1 | 12/2015 | Moran et al. |

OTHER PUBLICATIONS

U.S. Appl. No. 14/842,862, filed Sep. 2, 2015, Entitled: "Signal Via Positioning in a Multi-Layer Circuit Board," First Named Inventor: Sungjun Chun.

* cited by examiner

SIGNAL VIA POSITIONING IN A MULTI-LAYER CIRCUIT BOARD

BACKGROUND

The present application relates generally to circuit board manufacturing. More specifically, the present application is directed to signal via positioning in a multi-layer circuit board.

Printed circuit boards ("PCB") are generally fabricated from a plurality of laminated layers. Each of the layers typically includes a core fabricated from an insulating material, such as FR-4, epoxy glass, polyester or synthetic resin bonded paper, for example. Typically, a copper layer is bonded to one or both sides of the core. Circuits or "traces" are formed on the copper by applying a mask and removing unneeded copper. The individual layers are then laminated together to form the PCB.

Energy is typically transferred between layers of the PCB using power vias, signal vias, and ground vias. Power vias are usually thicker than signal vias to support higher electrical current per via. Signal vias are typically installed through all layers of a PCB even though the signal vias may only form an electrical connection between two of the layers. A portion of a signal via that extends through layers of the PCB beyond the points of electrical connection is referred to as a "stub". For high-speed signals, if stubs are not removed, sharp resonances can appear as an insertion loss, particularly in a differential signal pair.

Stubs can be removed by back-drilling the unused portion of the signal vias out of the PCB during manufacturing. However, the ability to back-drill signal vias is constrained by a minimum drilling distance defined between the signal vias, where electrical and mechanical properties of the PCB can be altered if the minimum drilling distance is violated. This minimum drilling distance effectively constrains the minimum pitch (i.e., center-to-center distance) that can be supported, and thus, limits signal density under a chip or module.

SUMMARY

Embodiments relate to a method of identifying, by a via placement tool executing on a processor of a circuit design system, a substantially uniform distribution of a plurality of signal vias for a multi-layer circuit board based on a design file defining a layout of the multi-layer circuit board that includes a plurality of via groups in a two signal via to one ground via ratio configuration. A signal via pitch is determined as a center-to-center distance between a neighboring pair of the signal vias. The signal via pitch is compared to a target minimum drilling distance to allow back-drilling of the neighboring pair of the signal vias. A ground via is identified proximate the neighboring pair of the signal vias. Based on the via placement tool determining that the signal via pitch of the neighboring pair of the signal vias is less than the target minimum drilling distance, at least one of the signal vias of the neighboring pair of the signal vias is positioned closer to the ground via such that after the positioning, the signal via pitch of the neighboring pair of the signal vias meets or exceeds the target minimum drilling distance. The design file is modified to include the positioning of the signal vias.

Embodiments also include a system having a design file that defines a layout of a multi-layer circuit board that includes a plurality of via groups in a two signal via to one ground via ratio configuration. A processor is configured to identify a substantially uniform distribution of a plurality of signal vias for the multi-layer circuit board based on the design file. A signal via pitch is determined as a center-to-center distance between a neighboring pair of the signal vias. The signal via pitch is compared to a target minimum drilling distance to allow back-drilling of the neighboring pair of the signal vias. A ground via is identified proximate the neighboring pair of the signal vias. Based on determining that the signal via pitch of the neighboring pair of the signal vias is less than the target minimum drilling distance, at least one of the signal vias of the neighboring pair of the signal vias is positioned closer to the ground via such that after the positioning, the signal via pitch of the neighboring pair of the signal vias meets or exceeds the target minimum drilling distance. The design file is modified to include the positioning of the signal vias.

Embodiments also include a computer program product. The computer program product includes a computer readable storage medium having computer readable program code embodied therewith. The program instructions are executable by a processor to perform a method that includes identifying, by a via placement tool executing on a processor of a circuit design system, a substantially uniform distribution of a plurality of signal vias for a multi-layer circuit board based on a design file defining a layout of the multi-layer circuit board that includes a plurality of via groups in a two signal via to one ground via ratio configuration. A signal via pitch is determined as a center-to-center distance between a neighboring pair of the signal vias. The signal via pitch is compared to a target minimum drilling distance to allow back-drilling of the neighboring pair of the signal vias. A ground via is identified proximate the neighboring pair of the signal vias. Based on the via placement tool determining that the signal via pitch of the neighboring pair of the signal vias is less than the target minimum drilling distance, at least one of the signal vias of the neighboring pair of the signal vias is positioned closer to the ground via such that after the positioning, the signal via pitch of the neighboring pair of the signal vias meets or exceeds the target minimum drilling distance. The design file is modified to include the positioning of the signal vias.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
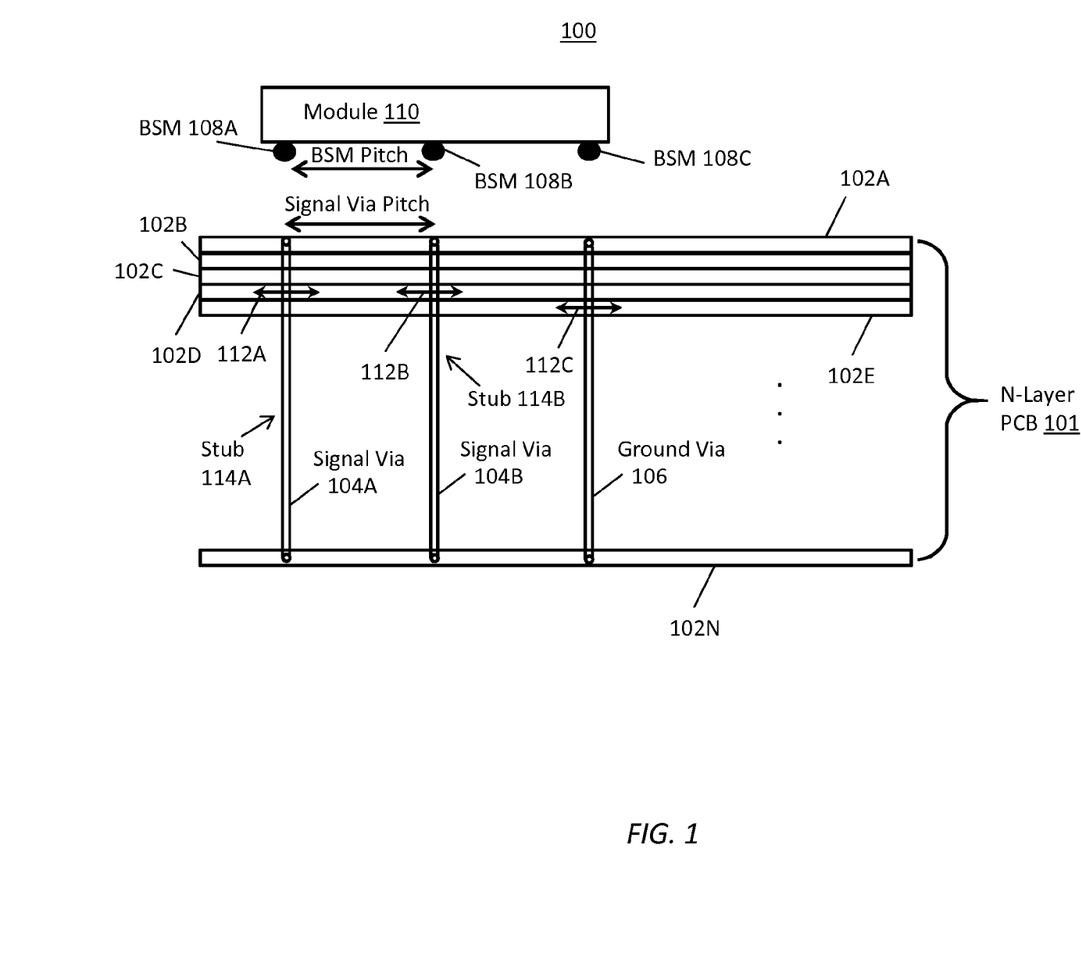
FIG. 1 is an exemplary diagram of a multi-layer circuit board manufactured according to aspects of exemplary embodiments.

Exemplary embodiments include systems, methods and computer program products for positioning of signal vias in a multi-layer circuit board. Signal vias may be grouped in neighboring pairs to support differential signaling through the multi-layer circuit board. Each neighboring pair of signal vias that supports differential signaling may also be associated with a ground via. Signal paths that include signal vias may be sensitive to additional "stub" material that extends beyond a signal path to the bottom of a multi-layer circuit board, also referred to as printed circuit board (PCB). As depicted in FIG. 1, a system 100 can include a multi-layer circuit board 101. In the example of FIG. 1, the multi-layer circuit board 101 includes N-layers 102, where "N" is an arbitrary number, such as twenty. Layer 102A is an uppermost layer that interfaces signal vias 104 and ground vias 106 to bottom surface metal 108 (e.g., conductive contacts) of a module 110. The module 110 can be a chip or any type of package that can be coupled to the multi-layer circuit board 101 to form the system 100.

Different paths 112 may be routed to different layers 102 of the multi-layer circuit board 101. For example, signal path 112A and signal path 11B may be routed in layer 102D, layers 102B and 102C may be reserved for other signal paths (not depicted), and ground path 112C may be routed in layer 102E. As depicted in FIG. 1, signal via 104A may extend between layer 102A and layer 102N of the multi-layer circuit board 101; however, the portion of signal via 104A between layers 102E and 102N forms a stub 114A since it extends below the signal path 112A. Electrical continuity is only needed between bottom surface metal 108A and the portion of signal via 104A that extends from layer 102A to layer 102D to reach the signal path 112A. Similarly, signal via 104B may extend between layer 102A and layer 102N of the multi-layer circuit board 101, and the portion of signal via 104B between layers 102E and 102N forms a stub 114B since it extends below the signal path 112B. Electrical continuity is only needed between bottom surface metal 108B and the portion of signal via 104B that extends from layer 102A to layer 102D to reach the signal path 112B. Ground via 106 also extends from layer 102A to layer 102N. Although the ground via 106 is only needed between layers 102A and 102E for bottom surface metal 108C in the example of FIG. 1, there is no detrimental effect to signal quality by leaving the portion of ground via 106 intact between layers 102E and 102N. By back-drilling signal via 104A and signal via 104B from layer 102N up to layer 102E, resonance effects can be reduced when stubs 114A and 114B are removed.

The center-to-center distances between a neighboring pair of bottom surface metal 108A and 108B is referred to as the bottom surface metal pitch. The center-to-center distance between a neighboring pair of the signal vias 104A and 104B is referred to as the signal via pitch. A minimum value of the signal via pitch is limited due to manufacturing constraints as a target minimum drilling distance to allow back-drilling of the neighboring pair of the signal vias 104. In embodiments, allow the bottom surface metal pitch to be designed with a value that is less than the target minimum drilling distance. In contrast, contemporary art solutions typically require that the bottom surface metal pitch be greater than the target minimum drilling distance.

Figure 2:
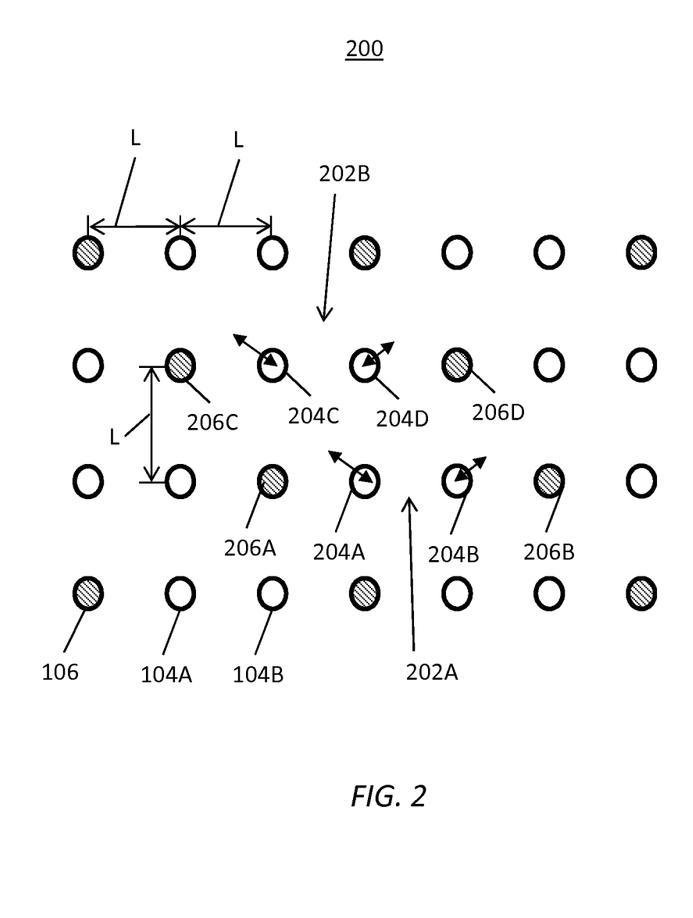
FIG. 2 depicts an example of a substantially uniform distribution of a plurality of signal vias and ground vias with a 2:1 signal-to-ground ratio in a multi-layer circuit board.

FIG. 2 depicts an example of a substantially uniform distribution 200 of a plurality of signal vias 104 and ground vias 106 in the multi-layer circuit board 101 of FIG. 1. The substantially uniform distribution 200 need not be a precisely uniform distribution and can vary within a manufacturing tolerance. As part of a manufacturing process, a via placement tool can be executed on a processor to determine and modify positioning of signal vias 104, ground vias 106, and power vias (not depicted) in the multi-layer circuit board 101. Initially, in the substantially uniform distribution 200, the signal vias 104A, 104B and ground vias 106 can be distributed substantially equally to align with the bottom surface metal pitch of the module 110 of FIG. 1, where the bottom surface metal pitch is referred to generally as length L. In the example of FIG. 2, vias 104 and 106 are grouped in a configuration of two signal vias 104 to one ground via 106. There can be many neighboring pairs of signal vias 104 to which embodiments are applied. For ease of explanation, positioning of four of the signal vias 104 is described in greater detail as signal vias 204A-204D. A neighboring pair 202A of the signal vias 104 includes signal vias 204A and 204B. A second neighboring pair 202B of the signal vias 104 includes signal vias 204C and 204D.

Since ground vias 106 do not need to be back-drilled, signal vias 104 can be moved closer ground vias 106 as long as a sufficient distance is maintained to prevent a short circuit to ground. By positioning the signal vias 104 closer to ground vias 106, the target minimum drilling distance can be maintained as the signal via pitch is increased to be greater than length L (i.e., the bottom surface metal pitch) by moving the signal vias 104 much closer to separate ground vias 106. Conversely, the distance between a number of the signal vias 104 and the ground vias 106 is reduced to be less than length L. In the example of FIG. 2, signal via 204A is positioned closer to ground via 206A (e.g., less than distance L), signal via 204B is positioned closer to ground via 206B, signal via 204C is positioned closer to ground via 206C, and signal via 204D is positioned closer to ground via 206D.

Figure 3:
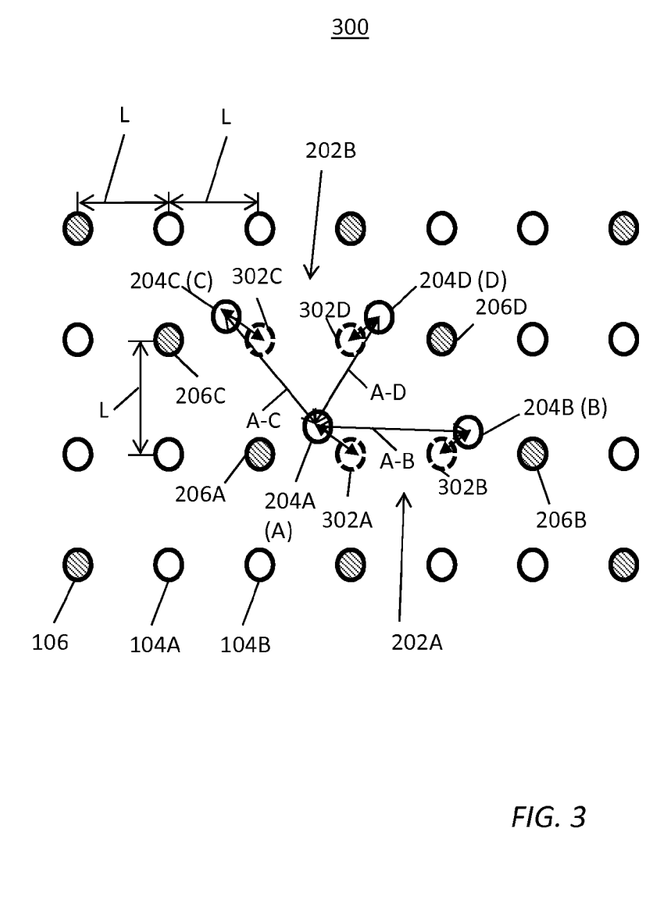
FIG. 3 illustrates changes in placement of the signal vias of FIG. 2 in accordance with an exemplary embodiment.

FIG. 3 illustrates changes in placement of the signal vias 204 of FIG. 2 in accordance with an exemplary embodiment as a modified distribution 300. In the example of FIG. 3, signal via 204A is depicted after shifting from position 302A closer to ground via 206A, where position 302A aligns with bottom surface metal of a module, such as bottom surface metal 108A of module 110 of FIG. 1. Similarly, signal via 204B is depicted after shifting from position 302B closer to ground via 206B, signal via 204C is depicted after shifting from position 302C closer to ground via 206C, and signal via 204D is depicted after shifting from position 302D closer to ground via 206D. In the example of FIG. 3, signal via 204A is a reference via "A" with respect to establishing positions of signal vias 204B, 204C, and 204D. Distance A-B is the signal via pitch (i.e., center-to-center distance) between signal vias 204A and 204B. Distance A-C is the signal via pitch between signal vias 204A and 204C. Distance A-D is the signal via pitch between signal vias 204A and 204D. Distances A-B, A-C, and A-D are all greater than length L. Thus, if length L is at or below a target minimum drilling distance, changing position of signal vias 204A-204D can be performed to increase the distances between each of the signal vias 204A-204D to allow back-drilling of the signal vias 204A-204D, where distances A-B, A-C, and A-D meet or exceed the target minimum drilling distance. This is further described with reference to FIG. 4. Again, although described in reference to four signal vias 204A-204D, the process of position adjustment can be applied to any number of the signal vias 104, 204 depending upon the relationship of the bottom surface metal pitch to the target minimum drilling distance.

Figure 4:
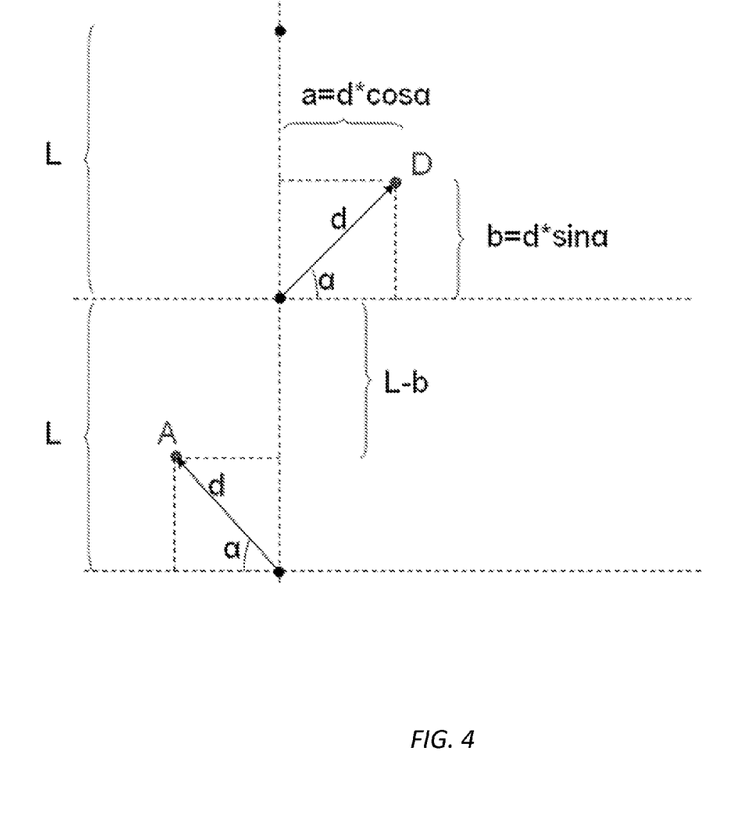
FIG. 4 illustrates lengths and angles used to determine placement of signal vias from neighboring pairs of signal vias according to aspects of exemplary embodiments.

FIGS. 3 and 4 illustrate lengths and angles used to determine placement of signal vias 204A-204D from neighboring pairs 202A, 202B of signal vias 204 according to aspects of exemplary embodiments. A first assumption to be satisfied is that the original distance between two signal vias 204 center-to-center is length L (i.e., the bottom surface metal pitch). A second assumption is that signal via 204A in its final back-drilling position is a reference point, referred to as "A". A third assumption is that the target minimum drilling distance to allow back-drilling is defined as Tb, e.g., 1 mm. The position of signal via 204B upon repositioning is referred to as "B", the position of signal via 204C upon repositioning is referred to as "C", and the position of signal via 204D upon repositioning is referred to as "D".

Three fundamental distances to be checked are distance A-B between A and B, distance A-C between A and C, and distance A-D between A and D. Other mutual distances are symmetric and do not need to be calculated. Additionally, movement of the signal vias 204A-204D is constrained to avoid a short circuit with one or more of the ground vias 206A-206D.

Distance A-B can be calculated as $L+2d*\cos\alpha$, where $\alpha$ is the angle between a horizontal axis and the direction of the shift as depicted in FIG. 4. A number of conditions need to be satisfied in placing the signal vias 204A-204D. Condition 1: $L+2d*\cos\alpha > Tb$. Distance A-C can be identical to the original distance before the shift and equal to $L*\sqrt{2}$, and thus is larger than L by construction. Condition 2: $L*\sqrt{2} > Tb$. Distance A-D is constrained by Condition 3 as: $\sqrt{L^2+4d^2+\cos^2(\alpha)} > Tb$. This can be visualized according to FIG. 4, where $a=d*\cos\alpha$, $b=d*\sin\alpha$, and distance $A-D=\sqrt{L^2+4a^2}$. Condition 4: the horizontal distance between A and ground via 206A, assuming signal via 204A and ground via 206A have the same radius (via_radius) is $L-(d*\cos\alpha+2*via\_radius) > 0$. Condition 5: the horizontal distance between B and ground via 206D, assuming signal via 204B and ground via 206D have the same radius (via_radius) is $L-(d*\sin\alpha+2*via\_radius) > 0$. Other signal to ground short conditions between signal and ground vias with a chance of touching are similar or further away and thus may not need to be computed.

As one example application, a desired bottom surface metal pitch (length L) is 0.8 mm. The target minimum drilling distance (Tb) is 1 mm, and angle $\alpha$ is tested with a value of 45 degrees (i.e., $\pi/4$). Thus, upon solving distance A-D for a value of d as $\sqrt{(0.8^2+4d^2\cos^2(\pi/4))}=1$, yields a value of d=0.4242 mm. Upon checking conditions 1-5, each condition is verified, and thus back-drilling could be supported with a bottom surface metal pitch of 0.8 mm using a 2:1 signal to ground via ratio configuration, where d=0.4242 mm and $\alpha=\pi/4$.

Figure 5:
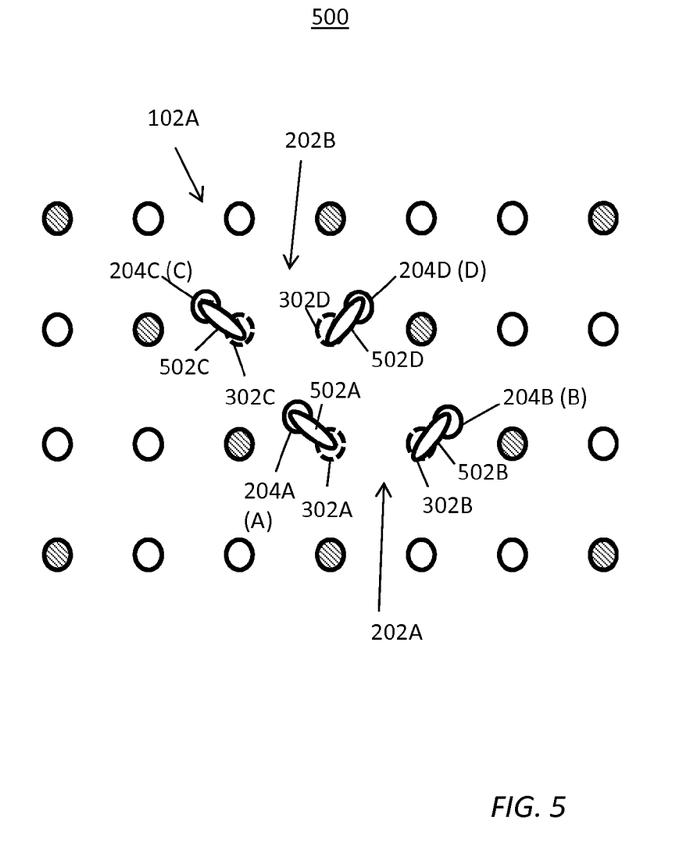
FIG. 5 depicts pad alterations to an uppermost layer of the multi-layer circuit board of FIG. 1 to align with bottom surface metal of a module to be coupled to the multi-layer circuit board in accordance with an embodiment.

In order to reposition the signal vias 204A-204D without requiring a shift or size change to the bottom surface metal 108 on module 110 of FIG. 1, pad alterations can be made to the uppermost layer 102A of the multi-layer circuit board 101 of FIG. 1 to align with bottom surface metal 108 of module 110 to be coupled to the multi-layer circuit board 101 as depicted in FIG. 5. Pad alterations 502A, 502B, 502C, and 502D may be in the form of "dogbones" that provide a conductive path on the uppermost layer 102A between each the positions A-D after the signal vias 204A-204D are shifted with respect to positions 302A-302D that reflect a substantially uniform distribution. Thus, even if the signal vias 204A-204D do not directly align with bottom surface metal 108 of FIG. 1 after positioning, the pad alterations 502A-502D can establish electrical continuity between the signal vias 204A-204D and respective bottom surface metal 108 of FIG. 1. Again, although only four instances of the pad alterations 502A-502D are depicted in FIG. 5, it will be understood that any number of pad alterations 502 may be included depending on the positioning of signal vias 204.

Figure 6:
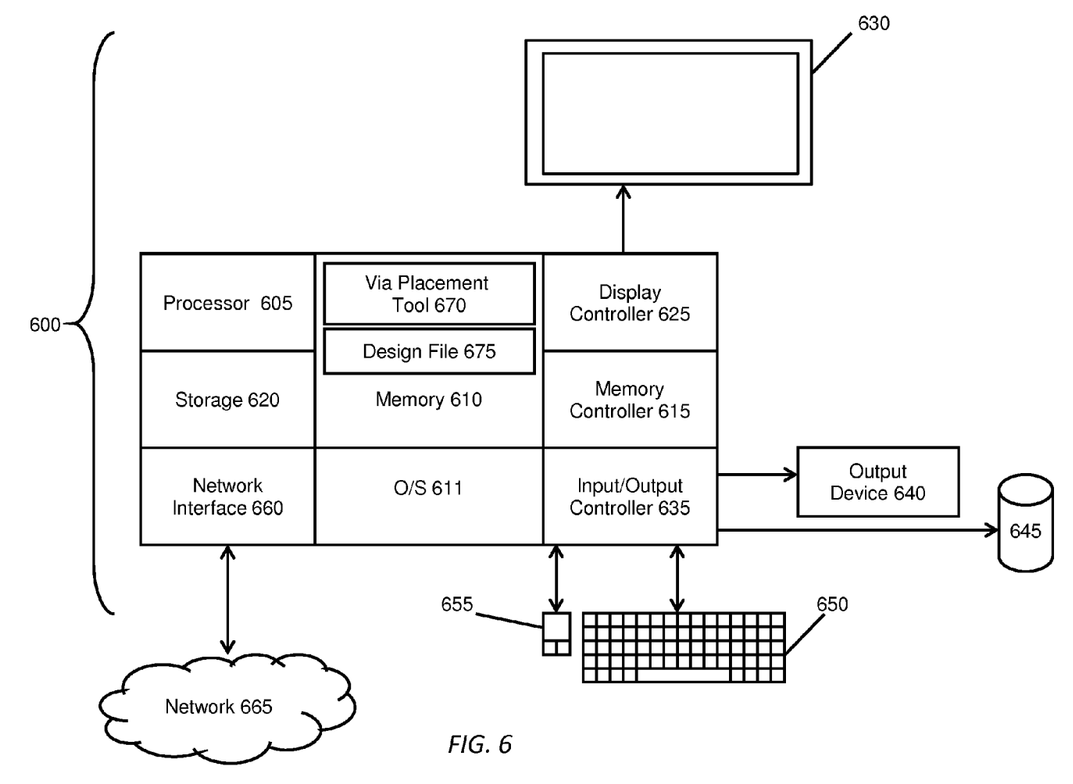
FIG. 6 illustrates a system for signal via positioning in a multi-layer circuit board in accordance with an exemplary embodiment.

FIG. 6 illustrates a block diagram of a computer system 600 for use in signal via positioning in a multi-layer circuit board according to some embodiments. The systems and methods described herein may be implemented in hardware, software (e.g., firmware), or a combination thereof. In some embodiments, the methods described may be implemented, at least in part, in hardware and may be part of the microprocessor of a computer system 600, such as a personal computer, workstation, minicomputer, tablet computer, mobile device, or mainframe computer. The computer system 600 is also referred to as circuit design system 600 and can be equipped with additional software and hardware to support circuit design, layout, and manufacturing of a multi-layer printed circuit board.

In some embodiments, as shown in FIG. 6, the computer system 600 includes a processor 605, physical memory 610 coupled to a memory controller 615, and one or more input devices 645 and/or output devices 640, such as peripherals, that are communicatively coupled power via a local I/O controller 635. These devices 640 and 645 may include, for example, a printer, a scanner, a microphone, and the like. Input devices such as a conventional keyboard 650 and mouse 655 may be coupled to the I/O controller 635. The I/O controller 635 may be, for example, one or more buses or other wired or wireless connections, as are known in the art. The I/O controller 635 may have additional elements, which are omitted for simplicity, such as controllers, buffers (caches), drivers, repeaters, and receivers, to enable communications.

The I/O devices 640, 645 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 605 is a hardware device for executing hardware instructions or software, particularly those stored in the physical memory 610. The processor 605 may be a custom made or commercially available processor, a central processing unit (CPU), an auxiliary processor among several processors associated with the computer system 600, a semiconductor based microprocessor (in the form of a microchip or chip set), a macroprocessor, or other device for executing instructions.

The memory 610 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 610 may incorporate electronic, magnetic, optical, or other types of storage media. Note that the memory 610 may have a distributed architecture, where various components are situated remote from one another but may be accessed by the processor 605.

The instructions in memory 610 may include one or more separate programs, each of which comprises an ordered listing of executable instructions for implementing logical functions. In the example of FIG. 6, the instructions in the memory 610 include a suitable operating system (OS) 611. The operating system 611 essentially may control the execution of other computer programs and provides scheduling, input-output control, file and data management, memory management, and communication control and related services.

Additional data, including, for example, instructions for the processor 605 or other retrievable information, may be stored in storage 620, which may be a storage device such as a hard disk drive or solid state drive.

The computer system 600 may further include a display controller 625 coupled to a display 630. In some embodiments, the computer system 600 may further include a network interface 660 for coupling to a network 665.

Systems and methods according to this disclosure may be embodied, in whole or in part, in computer program products or in computer systems 600, such as that illustrated in FIG. 6. For example, a via placement tool 670 can access a design file 675 to determine a layout definition of a multi-layer circuit board and transform the layout definition of the multi-layer circuit board according to the methods described herein for signal via positioning. The via placement tool 670 may be comprised of program instructions executable by the processor 605. The via placement tool 670 can be stored in a computer readable storage medium such as the memory 610 and/or storage 620. Similarly, the design file 675 can be stored in a computer readable storage medium such as the memory 610 and/or storage 620. The via placement tool 670 and/or design file 675 may be received over the network 665, and updates to the design file 675 can be transmitted over the network 665 to support other circuit board manufacturing operations. Although only a single via placement tool 670 and design file 675 are depicted in FIG. 6, it will be understood that the via placement tool 670 and/or design file 675 can be further subdivided, distributed, or incorporated as part of another application, file system, or data structure.

Figure 7A:
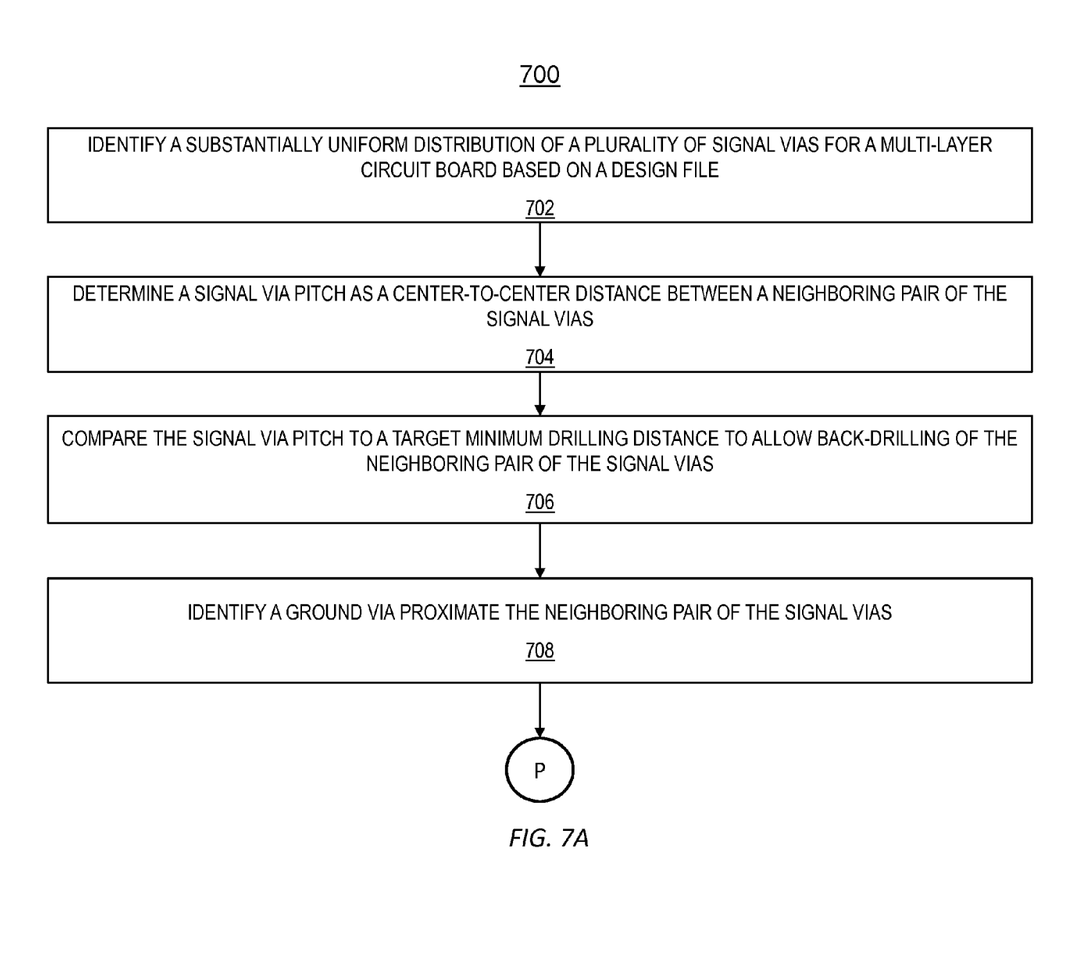
FIGS. 7A and 7B illustrate a process of positioning signal vias in a multi-layer circuit board in accordance with an exemplary embodiment.
Figure 7B:
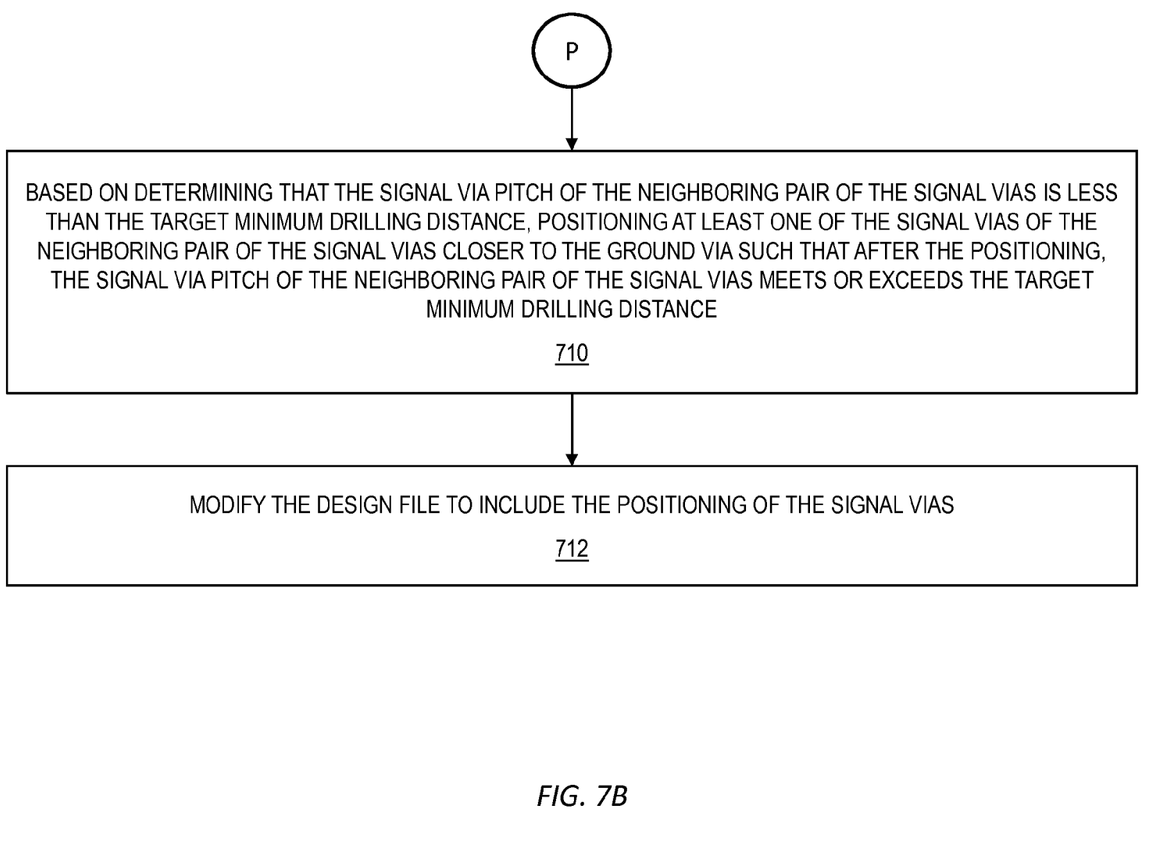

FIGS. 7A and 7B illustrate a flow diagram of a method 700 for signal via positioning in a multi-layer circuit board in accordance with an exemplary embodiment. The method 700 can be performed by the via placement tool 670 executing on the processor 605 of a circuit design system 600 of FIG. 6 and is further described in reference to FIGS. 1-6 for purposes of explanation. However, the method 700 of FIGS. 7A and 7B can be implemented on systems with alternate configurations and elements beyond those depicted in the examples of FIGS. 1-6. The design file 675 is readable by manufacturing equipment to produce a tangible realization of the system 100 of FIG. 1 that complies with the constraints and conditions as previously described.

At block 702, the via placement tool 670 executing on processor 605 of circuit design system 600 identifies a substantially uniform distribution 200 of a plurality of signal vias 204 for a multi-layer circuit board 101 based on a design file 675 defining a layout of the multi-layer circuit board 101.

At block 704, a signal via pitch is determined as a center-to-center distance between a neighboring pair of the signal vias 204, such as neighboring pair 202A of signal vias 204A and 204B and/or second neighboring pair 202B of signal vias 204C and 204D. The signal via pitch may initially be defined in the design file 675 as being equivalent to length L and/or may be determined by computing distances based on coordinates defined in the layout of the multi-layer circuit board 101. At block 706, the signal via pitch is compared to a target minimum drilling distance (Tb) to allow back-drilling of the neighboring pair of the signal vias.

At block 708, at least one ground via 206 is identified as being proximate the neighboring pair of the signal vias. For example, ground vias 206A and 206B are proximate the neighboring pair 202A of signal vias 204A and 204B, and ground vias 206C and 206D are proximate the second neighboring pair 202B of signal vias 204C and 204D. Since the neighboring pair 202A and second neighboring pair 202B of signal vias 204A-204D are also proximate each other, ground vias 206C and 206D may also be identified as being proximate the neighboring pair 202A of signal vias 204A and 204B, for instance.

At block 710, based on the via placement tool 670 determining that the signal via pitch of the neighboring pair of the signal vias is less than the target minimum drilling distance (Tb), at least one of the signal vias of the neighboring pair of the signal vias can be positioned closer to the ground via such that after the positioning, the signal via pitch of the neighboring pair of the signal vias meets or exceeds the target minimum drilling distance (Tb). For example, if the signal via pitch of the neighboring pair 202A of the signal vias 204A, 204B is initially defined as length L, the via placement tool 670 compares length L to target minimum drilling distance Tb and may determine the length L is less than Tb. To increase the margin between signal vias 204A and 204B, either or both signal vias 204A and 204B can be shifted closer to one or more ground vias, such as positioning signal via 204A closer to ground via 206A, positioning signal via 204B closer to ground via 206B, positioning signal via 204B closer to ground via 206D, and/or other such positioning adjustments that comply with the conditions and constraints as previously described.

As previously described, the layout of the multi-layer circuit board 101 can include a plurality of via groups in a two signal via to one ground via ratio configuration. Therefore, the method 700 can be applied in multiple dimensions, horizontally and vertically with respect to via groups that need placement adjustments to meet the target minimum drilling distance Tb. Multiple neighboring pairs of signal vias can be positioned as described above, where one signal via of the neighboring pair of the signal vias is defined as a reference via, e.g., signal via 204A of neighboring pair 202A is referred to as reference via A. The via placement tool 670 can determine positioning of the second neighboring pair 202B of the signal vias 204C, 204D proximate the reference via A such that the signal via pitch from the reference via A to each of the signal vias 204C, 204D in the second neighboring pair 202B of the signal vias 204C, 204D meets or exceeds the target minimum drilling distance Tb. Positioning can include shifting each of the signal vias 204A-204D of the neighboring pair 202A and the second neighboring pair 202B closer to different ground vias 206A-206D. Positioning the second neighboring pair 202B of the signal vias 204C, 204D can also include ensuring that the signal via pitch between the second neighboring pair 202B of the signal vias 204C, 204D meets or exceeds the target minimum drilling distance Tb.

At block 712, the design file 675 is modified to include the positioning of the signal vias 204A-204D. The design file 675 may also be modified to add one or more pad alterations 502A-502D to an uppermost layer 102A of the multi-layer circuit board 101 to align with bottom surface metal 108 of module 110 to be coupled to the multi-layer circuit board 101. Each of the one or more pad alterations 502A-502D can establish an electrical connection with one of the signal vias 204A-204D after the positioning.

Technical effects and benefits include modifying a design layout of a multi-layer circuit board such that signal vias in a 2:1 signal to ground via ratio configuration are separated to meet or exceed target minimum drilling distance defined by manufacturing constraints while maintaining the same bottom surface metal pitch under modules coupled to the multi-layer circuit board. This enables sufficient separation to perform back-drilling of the signal vias without compromising electrical or mechanical characteristics of the multi-layer circuit board. Alteration of the uppermost layer of the multi-layer circuit board can be performed to align with bottom surface metal of a module to be coupled to the multi-layer circuit board.

It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. A system comprising:
   a design file defining a layout of a multi-layer circuit board comprising a plurality of via groups in a two signal via to one ground via ratio configuration; and
   a processor configured to perform a method comprising:
       identifying a substantially uniform distribution of a plurality of signal vias and ground vias having a same horizontal and vertical separation distributed substantially equally in a horizontal and vertical grid pattern across the plurality of via groups for the multi-layer circuit board based on the design file;
       determining a signal via pitch as a center-to-center distance between a neighboring pair of the signal vias;
       comparing the signal via pitch to a target minimum drilling distance to allow back-drilling of the neighboring pair of the signal vias, wherein the target minimum drilling distance is a minimum center-to-center separation distance between the signal vias of the neighboring pair to maintain electrical and mechanical properties of the multi-layer circuit board after performing back-drilling of the neighboring pair of the signal vias;
       identifying a ground via proximate the neighboring pair of the signal vias;
       based on determining that the signal via pitch of the neighboring pair of the signal vias is less than the target minimum drilling distance, positioning at least one of the signal vias of the neighboring pair of the signal vias closer to the ground via such that after the positioning, the signal via pitch of the neighboring pair of the signal vias meets or exceeds the target minimum drilling distance;
       modifying the design file to include the positioning of the signal vias; and
       fabricating or having fabricated the multi-layer circuit board based on the modified design file.

2. The system of claim 1, wherein the two signal vias in each via group comprise a differential pair.

3. The system of claim 1, the processor is further configured to perform the method comprising:
   defining one signal via of the neighboring pair of the signal vias as a reference via; and
   positioning a second neighboring pair of the signal vias proximate the reference via such that the signal via pitch from the reference via to each of the signal vias in the second neighboring pair of the signal vias meets or exceeds the target minimum drilling distance.

4. The system of claim 3, wherein the positioning comprises shifting each of the signal vias of the neighboring pair and the second neighboring pair closer to different ground vias.

5. The system of claim 3, wherein positioning the second neighboring pair of the signal vias further comprises ensuring that the signal via pitch between the second neighboring pair of the signal vias meets or exceeds the target minimum drilling distance.

6. The system of claim 1, wherein the processor is further configured to perform the method comprising:
   adding one or more pad alterations to an uppermost layer of the multi-layer circuit board to align with bottom surface metal of a module to be coupled to the multi-layer circuit board, each of the one or more pad alterations establishing an electrical connection with one of the signal vias after the positioning while maintaining a same bottom surface metal pitch under the module that is less than the target minimum drilling distance.

7. The system of claim 1, wherein the plurality of signal vias for the multi-layer circuit board have a non-uniform distribution after the positioning.

8. A computer program product comprising:
   a non-transitory computer readable storage medium having program instructions embodied therewith, the program instructions executable by a processor to cause the processor to perform a method comprising:
       identifying, by a via placement tool executing on the processor of a circuit design system, a substantially uniform distribution of a plurality of signal vias and ground vias having a same horizontal and vertical separation distributed substantially equally in a horizontal and vertical grid pattern across a plurality of via groups for a multi-layer circuit board based on a design file defining a layout of the multi-layer circuit board comprising the plurality of via groups in a two signal via to one ground via ratio configuration;

determining a signal via pitch as a center-to-center distance between a neighboring pair of the signal vias;

comparing the signal via pitch to a target minimum drilling distance to allow back-drilling of the neighboring pair of the signal vias, wherein the target minimum drilling distance is a minimum center-to-center separation distance between the signal vias of the neighboring pair to maintain electrical and mechanical properties of the multi-layer circuit board after performing back-drilling of the neighboring pair of the signal vias;

identifying a ground via proximate the neighboring pair of the signal vias;

based on the via placement tool determining that the signal via pitch of the neighboring pair of the signal vias is less than the target minimum drilling distance, positioning at least one of the signal vias of the neighboring pair of the signal vias closer to the ground via such that after the positioning, the signal via pitch of the neighboring pair of the signal vias meets or exceeds the target minimum drilling distance;

modifying the design file to include the positioning of the signal vias; and fabricating or having fabricated the multi-layer circuit board based on the modified design file.

9. The computer program product of claim 8, wherein the program instructions executable by the processor further cause the processor to perform a method comprising:

positioning a second of the signal vias of the neighboring pair of the signal vias closer to a second ground via.

10. The computer program product of claim 8, wherein the two signal vias in each via group comprise a differential pair.

11. The computer program product of claim 8, wherein the program instructions executable by the processor further cause the processor to perform a method comprising:

defining one signal via of the neighboring pair of the signal vias as a reference via; and positioning a second neighboring pair of the signal vias proximate the reference via such that the signal via pitch from the reference via to each of the signal vias in the second neighboring pair of the signal vias meets or exceeds the target minimum drilling distance.

12. The computer program product of claim 11, wherein the positioning comprises shifting each of the signal vias of the neighboring pair and the second neighboring pair closer to different ground vias.

13. The computer program product of claim 11, wherein positioning the second neighboring pair of the signal vias further comprises ensuring that the signal via pitch between the second neighboring pair of the signal vias meets or exceeds the target minimum drilling distance.

14. The computer program product of claim 8, wherein the program instructions executable by the processor further cause the processor to perform a method comprising:

adding one or more pad alterations to an uppermost layer of the multi-layer circuit board to align with bottom surface metal of a module to be coupled to the multi-layer circuit board, each of the one or more pad alterations establishing an electrical connection with one of the signal vias after the positioning while maintaining a same bottom surface metal pitch under the module that is less than the target minimum drilling distance.

15. The computer program product of claim 8, wherein the plurality of signal vias for the multi-layer circuit board have a non-uniform distribution after the positioning.

* * * * *